United States Patent

Kloberdanz et al.

[11] Patent Number: 5,849,087
[45] Date of Patent: Dec. 15, 1998

[54] VACUUM TREATMENT SYSTEM FOR APPLYING THIN LAYERS TO SUBSTRATES SUCH AS HEADLIGHTS REFLECTORS

[75] Inventors: Hermann Kloberdanz, Linsengericht-Geislitz; Josef Hoffmann, Wörth am Main; Jürgen Henrich, Limeshain, all of Germany

[73] Assignee: Leybold Systems GmbH, Hanau, Germany

[21] Appl. No.: 886,675

[22] Filed: Jul. 1, 1997

[30] Foreign Application Priority Data

Jul. 4, 1996 [DE] Germany ................. 196 26 861.3

[51] Int. Cl.[6] .................................................. C23C 14/00
[52] U.S. Cl. .................... 118/719; 118/733; 204/298.25; 204/729; 204/730
[58] Field of Search ................ 204/298.25; 118/719, 118/733, 729, 730

[56] References Cited

U.S. PATENT DOCUMENTS 3,915,117 10/1975 Schertler ................. 118/719
5,415,729 5/1995 Strasser ................. 118/733

*Primary Examiner*—Richard Bueker
*Attorney, Agent, or Firm*—Felfe & Lynch

[57] ABSTRACT

In a vacuum treatment system for applying thin layers to substrates (2, 2', . . . ) such as headlight reflectors, with several treatment (8, 9, 10) and/or inward and outward transfer lock stations (20) supported on a stationary vacuum chamber wall (16, 16', . . . ) and with a rotatably supported internal cylinder (14), which is enclosed by the vacuum chamber wall and carries the substrate chambers (3–6), openings (24–27) are provided in the vacuum chamber wall (16, 16', . . . ), with which the substrate chambers (3–6) can be aligned and through which the treatment agents can be allowed to act on the substrates (2, 2', . . . ) and/or through which the substrates can be transferred in and out, where one of the substrate chambers, but at least the inward/outward transfer lock chamber (20), has as cover or a sealing flap (33), which allows direct access to the corresponding substrate chamber, and where the chamber (20) can be shifted (A, B) toward the internal cylinder (14) and pressed against the outside wall of the cylinder (14) or against the frame-like end surface of the substrate chamber (3).

13 Claims, 3 Drawing Sheets

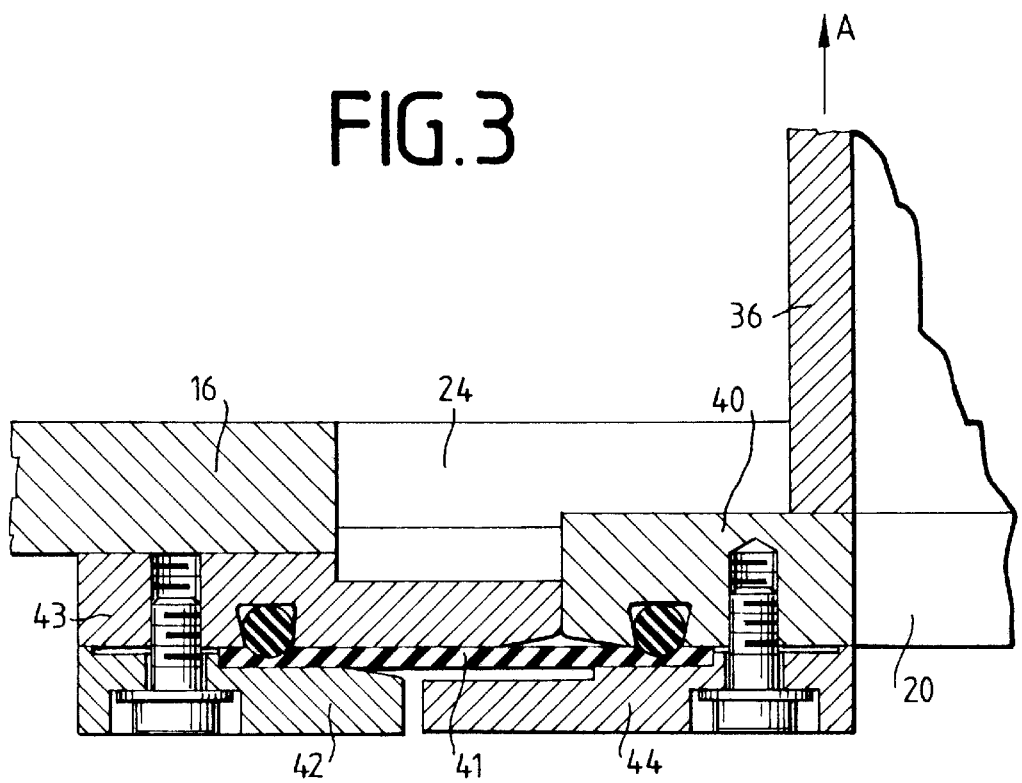
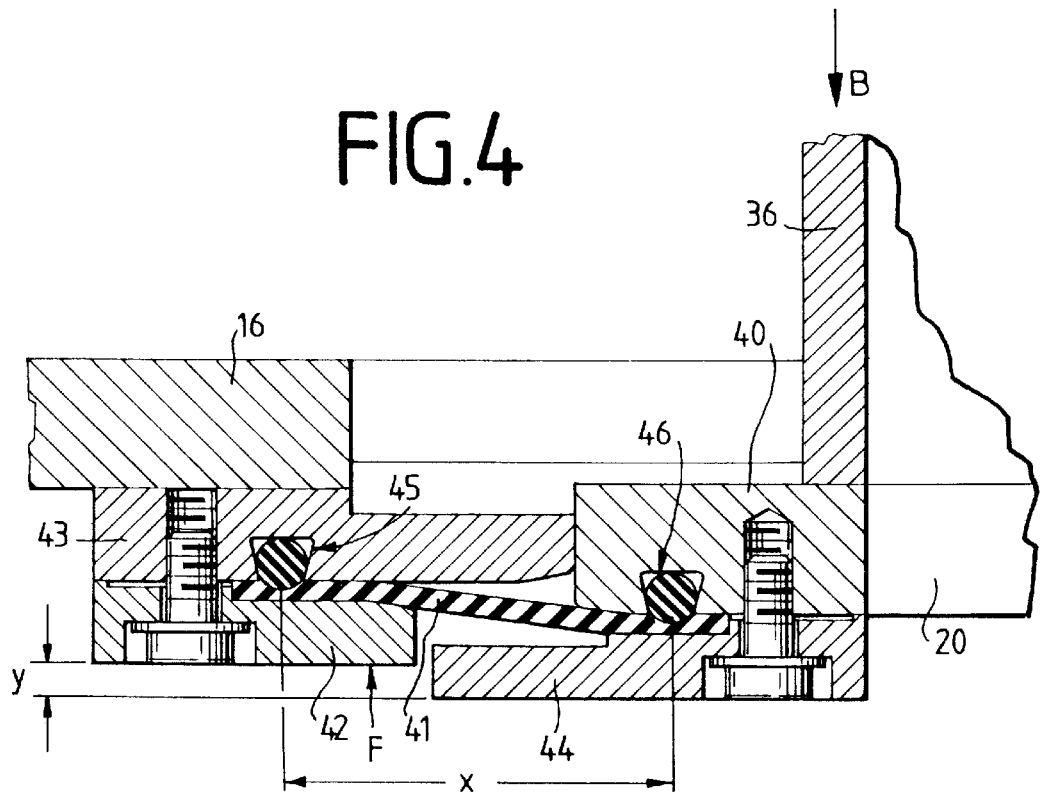

VACUUM TREATMENT SYSTEM FOR APPLYING THIN LAYERS TO SUBSTRATES SUCH AS HEADLIGHTS REFLECTORS

BACKGROUND OF THE INVENTION

The invention pertains to a vacuum treatment system for applying thin layers to substrates such as headlight reflectors, with several treatment stations and/or inward/outward transfer lock stations mounted on a stationary vacuum chamber wall; with a rotatably supported internal cylinder, which is surrounded by the vacuum chamber wall and carries the substrate chambers; and with openings in the vacuum chamber wall, with which the substrate chambers can be aligned and through which the treatment agents can act on the substrates and/or through which the substrates can be transferred in and/or out.

A disadvantage of the known apparatuses is to be found in their complicated construction, and it is also often true that they can be used only for a quite specific type of material to be coated such as flat, disk-shaped articles. The inward and outward transfer of the material to be coated is often associated with difficult sealing problems, which are solved by complicated transfer lock designs.

A vacuum coating system of the general type described above is known from DE-OS 2,241,634, in which the conveying device has a cup-shaped frame to hold the material to be coated, this frame being mounted on the common axis, around which it is able to pivot. In a treatment position, specifically in the inward and outward transfer position, a frame such as this itself forms a part of the wall of the entry and exit chamber, and a movable valve plate is provided to block off one end of the frame forming one part of the entry and exit chamber. In this known vacuum coating system, the inward and outward transfer of the material to be coated is solved by a simple design. The further movement of the material to be coated, especially into the vapor deposition position, however, is complicated. The cup-shaped frame containing the material is brought by means of the further rotation of the conveyor into a transfer position, from which the individual substrates are removed from the cup-shaped frame by a lifting device acting from underneath and moved upward into the actual vapor deposition chamber itself. As a result, a great deal of construction work is required to build this system, and the sequence of operations is also complicated and time-consuming.

A vacuum coating system for the deposition of thin layers from the vapor phase onto substrates is also known from DE 2,454,544. This system has an entry chamber, additional chambers for the treatment or coating of the substrates, and an exit chamber as well as a conveying device installed in an evacuatable main chamber to transport the substrates through the chambers. Sealing devices for temporarily sealing off the indicated chambers from the main chamber are also provided. The conveying device has a frame to hold the material to be coated, the frame being mounted on the common axis, around which it is able to pivot. In at least two treatment positions, namely, an entry position and an exit position, and also in a vapor deposition position, a frame of this kind itself forms part of the wall of the treatment chamber, namely, of the entry and exit chamber and of the vapor deposition chamber. In at least one of these treatment positions, a movable valve plate is provided to block off one end of the frame forming a part of the treatment chamber.

An apparatus for applying layers to supports under vacuum, especially for the alternate application of metal layers and glow-discharge polymerization layers to supports in the production of film capacitors, is also known (DE 2,848,480). This apparatus has at least two vacuum chambers, which are separated from each other by vacuum locks. During operation, the residual pressure in the first vacuum chamber is smaller than that in the second chamber or in the other chambers. The apparatus also has a transport device, which can convey the supports to be coated through a vacuum lock from the first vacuum chamber into the second vacuum chamber and back again through a separate lock into the first vacuum chamber or into a third vacuum chamber. Vacuum coating devices for applying layers to the supports located on the transport device are also provided in the vacuum chambers, and each of the vacuum locks between the chambers has several jaws, which are directly opposite a surface or surfaces of the transport device, leaving only a small gap between themselves and this surface or surfaces. Between each pair of jaws, a suction pipe is provided to draw off the residual gas. The transport device can move in only one direction, and the vacuum lock upstream of the first vacuum chamber in terms of the direction in which the transport device moves has longer diffusion distances than the vacuum lock located downstream of the first vacuum chamber in terms of the direction in which the transport device moves.

Finally, a vacuum chamber processing system for the surface treatment of substrates or workpieces is known (EP-A-0,555,764), which is designed in the form of a cylinder. At least one holding chamber or container for holding the substrates to be processed extends along the jacket of a circular or cylindrical distribution chamber. Outward-leading openings are provided on the periphery of these holding chambers. These openings, when in their proper positions for processing, line up with the corresponding processing stations arranged in the cylinder jacket to form the processing or process chambers. Either the holding chambers or containers or the cylinder jacket is designed to rotate around the center axis of the cylinder, so that the holding chambers or containers can move relative to the cylinder jacket and thus be moved from one processing station to another. Pneumatically or hydraulically actuated seals are provided on some or all of the holding chambers or containers and/or processing stations to seal off the processing or process chambers from each other during the processing operations.

SUMMARY OF THE INVENTION

The present invention is based on the task of creating an apparatus of the general type in question, in which a pressure-tight connection can be produced between the inward and outward transfer station on the one hand and the part carrying the substrate chambers or the associated area of the substrate chamber wall on the other.

This task is accomplished in accordance with the invention in that one of the substrate chambers, but at least the inward/outward transfer lock chamber, has a cover or a sealing flap, which allows direct access to the corresponding substrate chamber, where the chamber can be shifted toward the internal cylinder and pressed against the outside wall of the cylinder or the frame-like end surface of the substrate chamber, and where the base parts of the wall sections facing the cover or sealing flap are connected in a pressure-tight manner to the radially inward part of a frame-like flat seal of flexible material, which is connected in turn by its radially outward part in a pressure-tight manner to the boundary area around the opening in the vacuum chamber wall.

Additional details and features are described in greater detail and characterized in the dependent claims.

The invention can be embodied in a wide variety of ways; one of them is illustrated in greater detail in purely schematic fashion in the attached drawings:

FIG. 3 shows, on an enlarged scale, the sealing elements of the transfer lock station in the closed position according to FIG. 2; and FIG. 4 shows the sealing elements according to FIG. 3 but in the open position.

Figure 1:
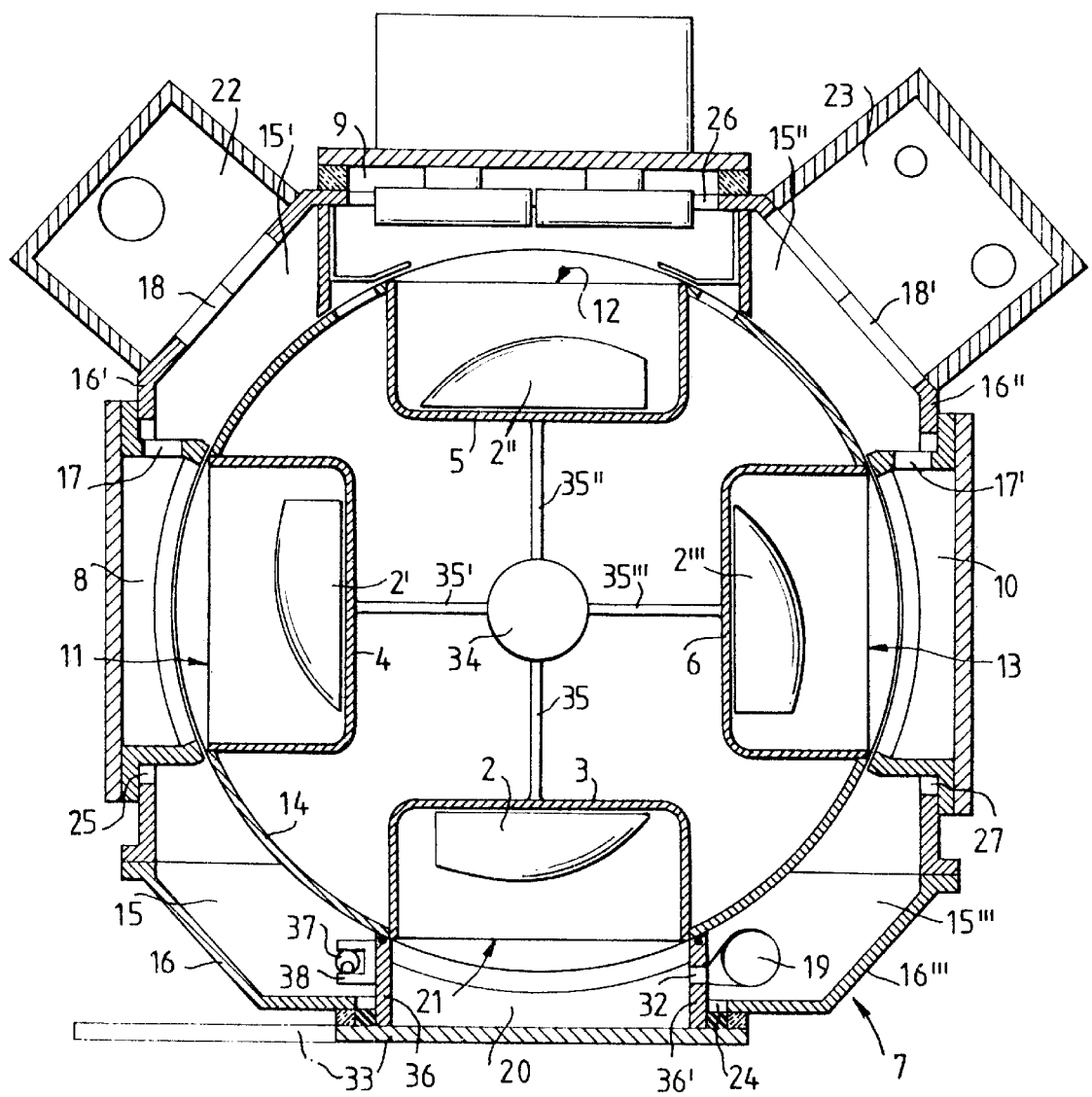
FIG. 1 shows a cross section through the system.

The apparatus has a vacuum chamber 7, which is provided with several window-like openings 24–27 spaced uniformly around the outside wall. These openings 24–27 are assigned to treatment stations 8, 9, 10 and to an inward/outward transfer lock station 20, each station consisting of a box-shaped, shell-like housing, open on the side facing the assigned opening 24–27, the circumferential boundary area of the box being permanently joined to wall 16, 16', . . . of vacuum chamber 7. Vacuum chamber 7 surrounds an internal cylinder 14, which is provided with openings 11, 12, 13, 21, which correspond to the previously mentioned openings in vacuum chamber 7, and into which substrate chambers 3–6, also in the form of shells, are inserted, which, together with treatment stations 8, 9, 10 and inward/outward transfer lock station 20, form containers closed on all sides when internal cylinder 14 is in the position shown in the drawing. The vacuum chamber wall is formed of outside wall parts 16, 16', . . . , which are connected tightly to the wall parts of treatment stations 8, 9, 10 and inward/outward transfer lock station 20, and thus, together with the chamber wall parts and internal cylinder 14, form outside chambers 15, 15', . . . Two of these outside chambers 15, 15', . . . are connected by holes 17, 17' to the inside walls of two treatment stations 8, 10; outside wall parts 16', 16", . . . of these two outside chambers 15', 15" are connected tightly to sources 22, 23, through which gases or monomers can be allowed to enter outside chambers 15', 15" via holes 18, 18', so that a glow-discharge process, for example, can be carried out in treatment station 8 and a coating process in station 10. In the housing of treatment station 9, two sputter cathodes 28, 29 are installed; the required power supply 30 is attached to the outside wall of treatment station 9. Outside chamber 15''' is connected to transfer lock station 20 by a hole 32, which in turn is connected to suction port 19 of a vacuum pump (not shown in detail). For the purpose of inward and outward transfer, cover 33, which forms the bottom part of the shell-like housing, can be slid into the position shown in dot-dash line. All of the chambers, namely, treatment stations 8, 9, 10, transfer lock chamber 20, substrate chambers 3–6, outside chambers 15, 15', . . . , and internal cylinder 14, are covered by a common bottom plate 34 and a cover plate (not shown), which means that the structure of the apparatus is extremely simple. Internal cylinder 14 is attached by arms 35, 35', . . . to a motor 34 in a torsion-proof manner, so that the structure formed by internal cylinder 14 and substrate chambers 3–6 can rotate inside the vacuum chamber itself, formed by the bottom plate, the cover plate, and outside wall parts 16, 16', . . .

So that inward/outward transfer lock chamber 20 can be vented by sliding cover 33 into the open position without causing any change in the pressure in the other treatment chambers 8, 9, 10, side walls 36, 36', . . . of transfer lock station 20 are designed to slide a short distance in the direction of arrow A. This displacement of the side walls or of the frame-like part of transfer lock station 20 toward internal cylinder 14 has the effect that transfer lock station 20 rests in a vacuum-tight manner against wall 14 and thus allows the station to be opened and vented without the pressure experiencing any change in vacuum chamber 7 as a whole. The displacement of side walls 36, 36', . . . of station 20 is brought about by camshafts 37, 37', . . . , which cooperate with connecting members 38, 38', . . . , which are permanently joined to side walls 36, 36', . . . (only one of which, however is shown in FIG. 1 for the sake of clarity).

Figure 2:
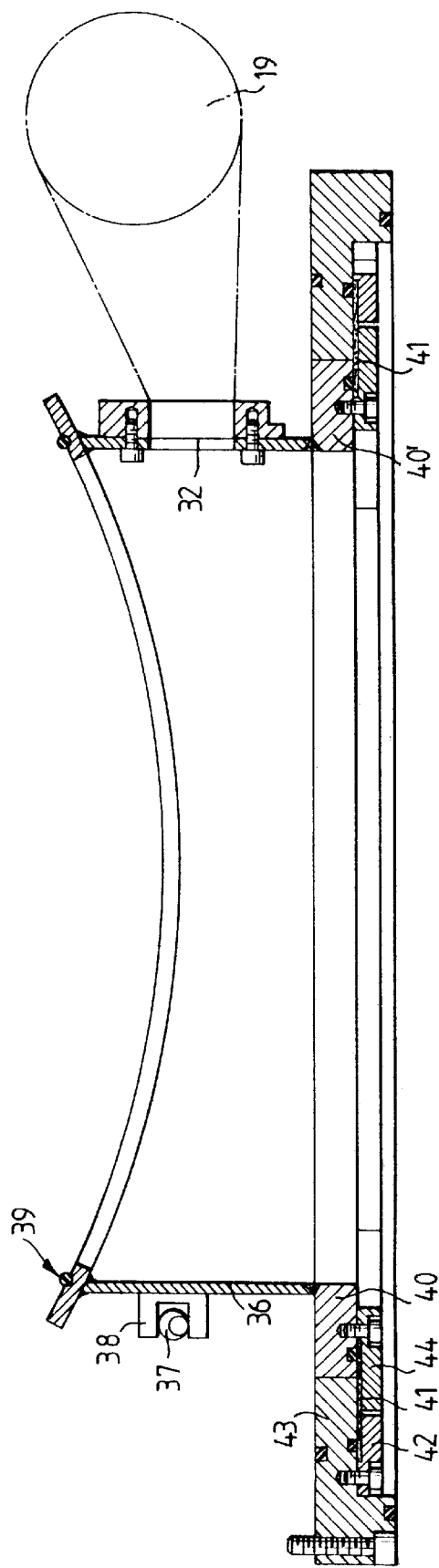
FIG. 2 shows the frame-shaped part of the transfer lock station of the system according to FIG. 1, but on an enlarged scale and in cross section.

As FIG. 2 shows (on an enlarged scale), side walls 36, 36', . . . are provided with a frame-like seal 39, which can be pressed and sealed against the outside surface of cylindrical wall 14. For this purpose, base parts 40, 40', . . . move also in closing direction A (see also FIGS. 3 and 4); the original position from which they start to move is shown in detail in FIG. 4. To ensure that side surface 36, 36', . . . seals properly against wall parts 16, 16''' of vacuum chamber 7, base parts 40, 40', . . . are each connected firmly to a flat, frame-like seal 41, the radially outer parts of which are pressed by a frame 42 against wall parts 16, 16''' or against an auxiliary frame 43. This auxiliary frame 43 or its outside surface F forms the sealing surface for the transfer lock flap or cover 33.

What is claimed is:

1. A vacuum treatment system for applying thin layers to substrates, said system comprising:

a vacuum chamber including a vacuum chamber wall;

a stand rotatably supported in the vacuum chamber and surrounded by the vacuum chamber wall, said stand carrying a plurality of substrate chambers;

the vacuum chamber wall having a plurality of boundary portions each defining a respective opening with which the substrate chambers can be aligned by rotation of the stand; each of said openings having a station associated therewith, at least one of said stations being a treatment station, and the opening of said treatment station being configured so that through said opening treatment agents can be caused to act on the respective substrate in the aligned substrate chamber, and at least one of the stations being an inward/outward transfer lock station through the opening of which the substrate of a substrate chamber aligned therewith can be transferred into and out of said vacuum chamber;

said transfer station being movable toward the stand to engage with an outside wall of the stand or with a frame-like end surface of the substrate chamber aligned therewith;

a generally frame-like seal formed of a flexible material, said seal being secured in a pressure-tight manner to the boundary portion of the opening of the transfer lock station, and extending generally inwardly of the opening therefrom to an inward edge portion of said seal;

the transfer lock station having
a cover providing access to the associated substrate;
a base portion secured in a pressure-tight manner with the inward edge portion of the seal; and
a wall portion connected with the base portion and extending toward the substrate chamber;
said seal allowing the transfer lock station to move toward and away from engagement with the substrate chamber.

2. The invention according to claim 1, wherein said stand is substantially cylindrical between the substrate chambers.

3. The invention according to claim 1, wherein the inward edge portion of the seal is clamped in engagement between the base portion of the transfer station and a clamping structure.

4. The invention according to claim 2, wherein the seal has a radially outward portion adjacent the boundary portion of the vacuum chamber wall and said outward portion is clamped between the boundary portion of the vacuum chamber wall and a second clamping structure.

5. The invention according to claim 3, wherein the distance between the point of engagement of the clamping structures and the seal is approximately 12 times the distance that the lock station travels in and out of engagement with the stand or substrate chamber.

6. The invention according to claim 1, and said base portion and said vacuum chamber wall each having a respective groove therein extending around the opening; and a sealing structure supported in each of said grooves and engaging the frame-like seal.

7. The invention according to claim 6, wherein the sealing structures comprise sealing beads.

8. The invention according to claim 6, wherein the sealing structures each comprise a sealing ring.

9. The invention according to claim 1, wherein said vacuum chamber wall includes an auxiliary frame thereon engaging with the seal and forming a pressure-tight sealing engagement therewith.

10. The invention according to claim 3, wherein the clamping structure comprises a clamping frame.

11. The invention according to claim 3 wherein the clamping structure comprises a plurality of clamping elements.

12. The invention according to claim 1 and said vacuum chamber wall boundary portion and the base portion of the transfer lock station being formed so that each has a surface that forms a continuous contact surface engaging with the flat seal.

13. The invention according to claim 1 and said boundary portion, said seal, said base portion, and said wall portion together being pressure tight so that external atmospheric pressure does not pass therethrough into the vacuum chamber.

* * * * *